(12) United States Patent
Janusch

(10) Patent No.: US 7,675,306 B2
(45) Date of Patent: Mar. 9, 2010

(54) PROBER APPARATUS AND OPERATING METHOD THEREFOR

(75) Inventor: Peter Janusch, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/043,365

(22) Filed: Mar. 6, 2008

(65) Prior Publication Data

US 2008/0272795 A1  Nov. 6, 2008

Related U.S. Application Data

(60) Provisional application No. 60/916,205, filed on May 4, 2007.

(51) Int. Cl.
  *G01R 31/02* (2006.01)
  *G01R 31/26* (2006.01)

(52) U.S. Cl. .................. 324/760; 324/754; 324/765; 219/444.1

(58) Field of Classification Search .......... 324/754–765
  See application file for complete search history.

(56) References Cited

U.S. PATENT DOCUMENTS

| | | | |
|---|---|---|---|
| 6,593,761 B1* | 7/2003 | Fukasawa et al. | 324/754 |
| 6,765,401 B2* | 7/2004 | Hamada | 324/760 |
| 7,332,918 B2* | 2/2008 | Sugiyama et al. | 324/754 |
| 2006/0152239 A1* | 7/2006 | Nam et al. | 324/760 |
| 2007/0132469 A1* | 6/2007 | Yano | 324/760 |

* cited by examiner

*Primary Examiner*—Ha Tran T Nguyen
*Assistant Examiner*—Emily Y Chan
(74) *Attorney, Agent, or Firm*—Slater & Matsil, L.L.P.

(57) ABSTRACT

An operating method for a prober apparatus is disclosed which includes controlling the temperature of at least one part of the prober apparatus. Another operating method for a prober apparatus includes production and transfer of thermal energy between means for the exchange of heat and at least one component of the prober apparatus, wherein the production, the transfer or the production and the transfer of thermal energy is controlled. A prober apparatus includes at least one heat exchange element disposed in a spatial relation to at least one probe tool support so as to have an impact on the temperature thereof.

10 Claims, 3 Drawing Sheets

PROBER APPARATUS AND OPERATING METHOD THEREFOR

This application claims the benefit of U.S. provisional application Ser. No. 60/916,205, which was filed on May 4, 2007 and which is incorporated herein by reference in its entirety.

TECHNICAL FIELD

Disclosed herein is a prober apparatus, for instance a wafer prober machine, and a setup operating method therefor.

BACKGROUND

High OEE (overall equipment efficiency) needs to focus on measurement time and also probing setup time as well. Operation of a prober apparatus for testing semiconductor products such as wafers or dice is often delayed due to time-consuming ramp up procedures. For instance, when a different product is to be tested, certain test insertions and settings of the apparatus have to be changed. In other instances, worn-out tools have to be replaced or other maintenance is necessary. Upon completion of such activities, the prober apparatus will be restarted or set up for the new requirements. Especially when testing procedures are to be performed at very high or low temperatures, acclimatization of the prober apparatus, i.e., adaptation of the apparatus in terms of developing steady state thermal strains of its components due only to the radiation of the hot or cold device under test, requires a considerable amount of time (up to five hours) during which productive testing cannot take place. Productive testing of semiconductor products under predefined temperature conditions requires thermal equilibrium of the testing environment.

BRIEF DESCRIPTION OF THE DRAWINGS

An exemplary embodiment of a temperature controlled part of a prober apparatus is described with reference to the drawings, wherein.

DETAILED DESCRIPTION OF ILLUSTRATIVE EMBODIMENTS

Figure 1:
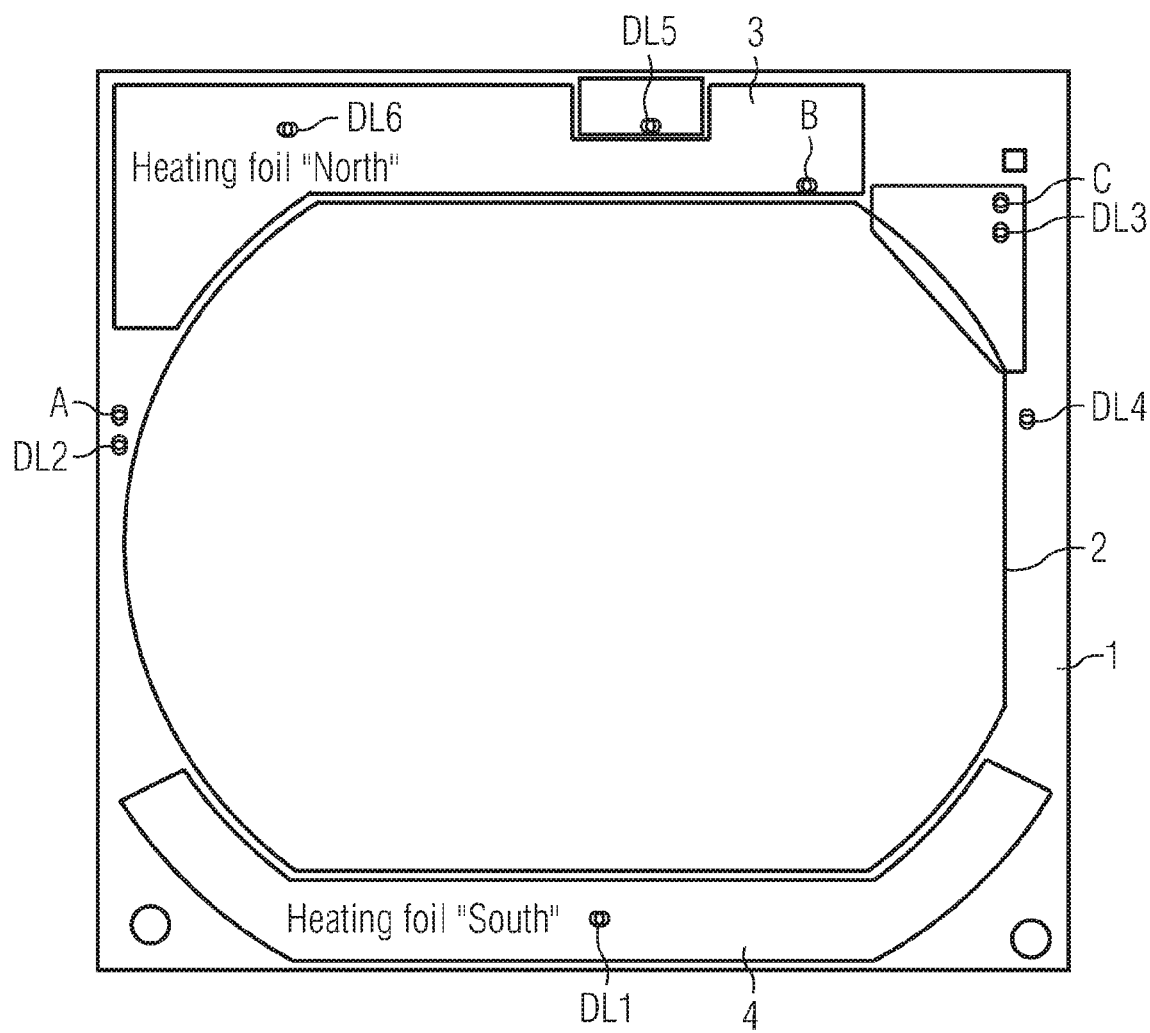
FIG. 1 shows a temperature controlled headplate of a prober apparatus.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In preferred embodiments, a method for operating a prober apparatus comprises actively changing the temperature of a probe tool support of the prober apparatus. Changing the temperature of the probe tool support, as used herein, includes heating as well as cooling. The proposed method may involve actively changing and controlling the temperature of the headplate of the prober apparatus for memory as well as for logic and other products. In many instances, the headplate supports the probe tool or probe tools. In other cases, the headplate supports a specialized probe tool support.

Actively changing and controlling the temperature of the headplate will quickly change the temperature of the probe tool and/or the probe tool support, as the case may be. The proposed method may also involve actively changing the temperature of a probe tool. In this case, thermal energy may also be transferred from the probe tool to the probe tool support and, via the probe tool support, to surrounding components of the prober apparatus, as for instance a headplate.

It is to be understood that it is neither feasible nor necessary to specify temperatures, quantities of energy to be transferred etc. Rather, the concept of the method and apparatus disclosed herein provides the person skilled in the art with a tool for significantly decreasing setup and ramp-up time of a prober apparatus. The target temperature and thus, the quantity of energy needed, will be easily determined with a few thermal stability experiments or, as will be described in more detail below, by means of controlled heat transfer. For instance, experiments have shown that for a test temperature of +88° C. in a wafer prober machine, controlled heat transfer to the headplate must be targeted at reaching a temperature of 36° C., because this is the stationary temperature of the headplate when thermal equilibrium is reached. At other test insertions like (−40° C.) a target temperature of 32° C. will be automatic controlled. To heat the headplate up to this temperature will significantly reduce the time span needed to reach equilibrium. Switching over from low to high and back to low temperature measurement followed and controlled by the right headplate target temperature is implemented at the prober operating menu and coupled with the chuck temperature The prober apparatus disclosed herein includes a heat exchange element disposed in a spatial relation to a probe tool support so as to have an impact on the temperature thereof. A heat exchange element, as used herein, shall mean any device capable of heating and/or cooling another body in its proximity. In other words, a heat exchange element may either produce heat or coldness (commonly and uniformly referred to as thermal energy hereinafter) by itself and then transfer it to the probe tool support or another component of the prober apparatus adjacent the heat exchange element, or be supplied with thermal energy from an external thermal energy source and transfer this thermal energy to the probe tool support or another component of the prober apparatus adjacent to the heat exchange element. Transfer of thermal energy, as used herein, may involve any or all of conduction, radiation and convection of heat.

Figure 4:
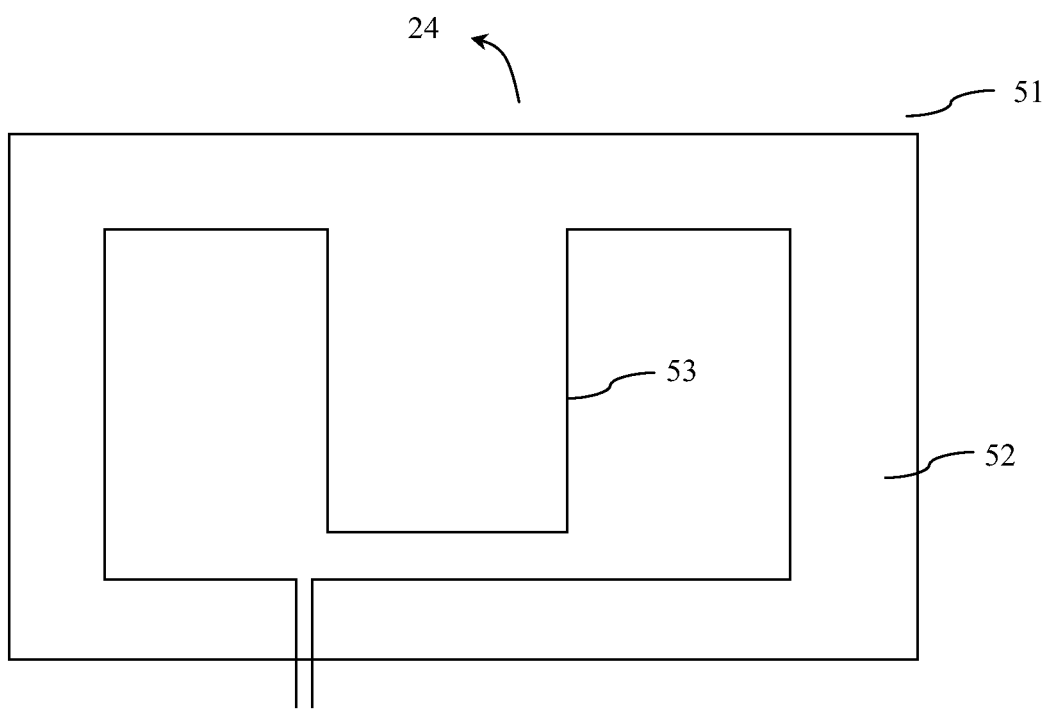
FIG. 4 shows a heat exchange element having a heating foil that includes a carrier sheet supporting a heating wire.

In one embodiment, the heat exchange element 24 comprises a heating foil 51 as illustrated in FIG. 4. The heating foil 51 may, for instance, comprise a carrier sheet 52 supporting a heating wire 53 which is capable of producing heat and of transferring the heat to the body to which it is attached. The carrier sheet 52 may be made of a thin polymer film and/or may be self-adhesive. For a heating foil 51 as described above, production and transfer of thermal energy to a component of the prober apparatus take place at the same location, the place where the foil is attached to the headplate 1 (FIG. 1) of the apparatus. The heating wire 53 is fed from a source of electric energy (not shown). Due to its resistance, a part of the electric energy is converted to heat (thermal energy is "produced," as used herein). Then, because the heating foil 51 is glued to the surface of a component of the apparatus, the heat is transferred to this component. In other embodiments, the places of production and transfer of thermal energy are spaced apart.

The body to which it is attached may, for instance, be a probe tool support, the headplate of the prober apparatus or another component of the prober apparatus which is arranged in the proximity of the probe tool. The body to which the heat exchange element is attached may be made of a material of great heat conductivity. The heat exchange element may, for instance, be attached to an upper or lower surface of the headplate of the prober apparatus. The headplate comprises a plate at the top of the prober apparatus, the plate forming a top wall, having a circular opening and supporting on its upper or lower surface at least one probe tool, for instance, a probe card. The heat transferred enters the top surface of the headplate and causes thermal strains in the headplate.

These thermal strains effect a displacement of the probe tool in all directions (x, y, z, theta, etc.). The heat is conducted by the material of the headplate and thus, transferred to the probe tool which is supported by the headplate. Subsequently, the heat also causes thermal strains in the probe tool which lead to a displacement of the probe tips of the probe tool. After a relatively short time of heat transfer from the heating foil to the headplate and the probe tool, the apparatus reaches a steady state of temperature distribution and thermal strains in the headplate and the probe tool, i.e., thermal equilibrium.

Experiments have shown a significant decrease in setup and ramp up time (i.e., the time from the beginning of thermal energy transfer until a steady state was reached) when the proposed method was used.

Especially in, but not limited to, cases where a target temperature for the ramp-up procedure is known or can be determined, controlled production or transfer or production and transfer of thermal energy between means for the exchange of heat and a component of the prober apparatus may be utilized, for instance, to significantly shorten the procedure and/or improve reliability and stability of the process. In one embodiment, production and/or transfer of thermal energy takes place in a closed loop control. This closed loop control may, for instance, be temperature-driven for low and/or high temperature measurement at probing process.

To this end, the proposed prober apparatus may comprise a control unit. The control unit may be connected to one or more temperature sensors which may be attached to components of the apparatus as, for instance, a probe tool, probe tool support or the housing of the prober apparatus, its headplate and so on. The control unit may be adapted so as to control production and/or transfer of thermal energy by means of pulse width modulation. For example, pulses of electric energy may be fed to a heat exchange element, for instance, a heating foil, a cooling apparatus or the like. Variation of the width of these pulses of source energy result in variations of output power, i.e., changes in the quantity of thermal energy produced. In the case of the heat exchange element being heating foils with different architecture and power consumption values attached to a component of the prober apparatus, controlling the production of thermal energy at the same time means to control the transfer of this energy to the body to which the heat exchange element is attached. In other cases, where production of thermal energy takes places in a location apart from the location of the transfer, either the production or the transfer may be controlled. It is, of course, also possible to control both parts as this may further stabilize the process.

A prober apparatus comprises a housing for providing a testing environment which is needed for performing electronic tests on a device under test, usually a wafer or other semiconductor products, under certain testing conditions, which may be determined by an expected operating temperature of the device under test. The housing has a top wall, the so called headplate 1, which is shown in FIG. 1. The headplate is used to support one or more probe tools, e.g., probe cards with one or more probe tips for making electrical contact with electric terminals of the device under test. The headplate 1 has an insert part 2, which enables the electric contact between the probe tool and the device under test that is disposed inside the housing and underneath the insert part 2 of the headplate 1. During testing, the insert part 2 is closed and docked by a cover which will be mounted on top of the headplate 1 before testing begins.

As shown in FIG. 1, two heat exchange elements 3 and 4 are disposed on the headplate 1 in a heat conducting manner. In the present case, the heat exchange elements 3 and 4 are electrically operated heating foils "North" (3) and "South" (4), which may directly produce heat and, due to their contact with the headplate 1, transfer the heat produced to the headplate 1. Thus, the headplate 1 is the temperature controlled part of the prober apparatus. By heating the headplate 1 through the operation of the heating foils 3 and 4, a uniform temperature of the headplate 1 is attained within a very short period of time.

Since the headplate 1 supports the probe tool or tools, that is to say the headplate 1 has heat conducting contact with the probe tool, heat will also be transferred from the headplate 1 to the probe tool. Again, the probe tool will reach a stationary temperature level in a very short time due to this heat transfer. Without the heat exchange elements 3 and 4, the ramp-up time of the prober apparatus would depend largely upon the radiation of heat from the device under test to the headplate 1 and the probe tool. By providing the headplate with means for selectively controlling the temperature of the headplate 1, and the resulting temperature control of the probe tool, the ramp-up time can be significantly reduced.

In an experimental configuration, the headplate in FIG. 1 is prepared for closed-loop control of its temperature. To this end, the headplate 1 is equipped with several temperature sensors, namely sensor A (disposed on the "West" bridge of the headplate 1 with a distance from the heating foil "North" 3), sensor B (disposed on the "North" bridge of the headplate 1 and on the heating foil "North" 3), and sensor C (disposed on the "NorthEast" corner of the headplate 1 with a distance from the heating foil "North" 3). Furthermore, measuring points DL1 through DL6 for a data logger are provided.

Figure 2:
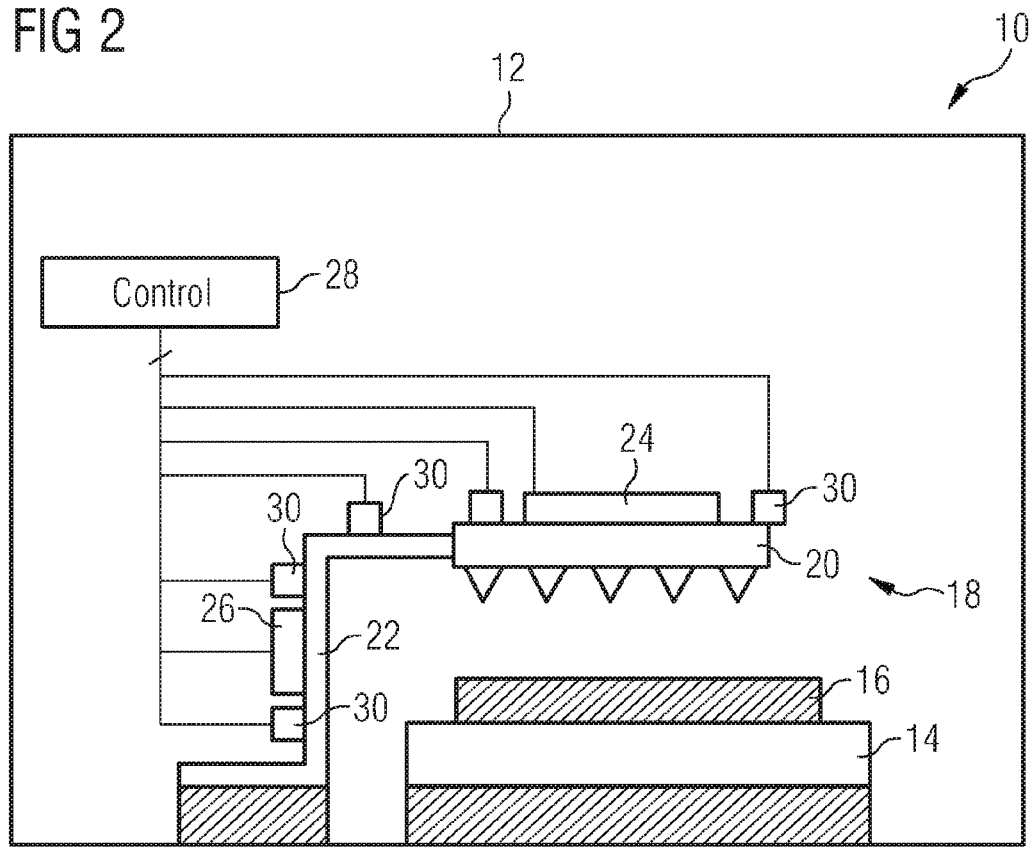
FIG. 2 shows a prober apparatus of the present invention.

FIG. 2 illustrates an exemplary prober apparatus 10 that can utilize aspects of the present invention. A housing 12 provides a testing environment. A support structure 14 is located inside the housing 10 and is configured to support a device under test 16. For example, the device under test could be a semiconductor wafer or other electronic device. A prober 18 is disposed adjacent the support structure 14 and is configured to perform electronic tests on the device under test 16. The prober 18 can include a probe card 20 and a probe tool support 22.

As discussed above, a heat exchange element or elements can be disposed adjacent the prober 18. The heat exchange element(s) are configured for the dedicated temperature control of at least one part of the prober 18. In the illustrated example, a heat exchange element 24 is configured for the dedicated temperature control of the probe card 20 and a heat exchange element 26 is configured for the dedicated temperature control of the probe tool support 22. In other embodiments, more or fewer heat exchange elements can be included.

FIG. 2 also shows a controller 28 coupled to the heat exchange elements. While illustrated within the housing 12, in many embodiments the controller 28 will be outside the temperature controlled environment. As discussed above, the controller 28 performs closed loop control of the heat exchange element(s). This control can be facilitated by the use of temperature sensors 30 that are coupled to the controller. Preferably, the temperature sensors are attached to the temperature controlled part(s) of the prober apparatus 10.

Figure 3:
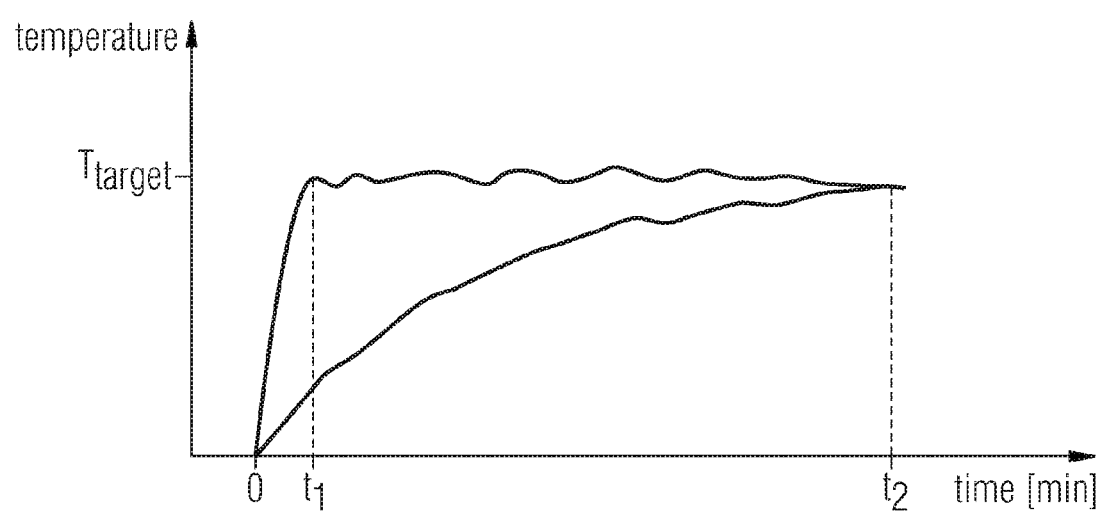
FIG. 3 shows a temperature chart of the headplate of the prober apparatus with and without temperature control of a selected part of the apparatus.

The temperature progression with and without dedicated heating of headplate 1 is shown in FIG. 3. In one example, the target temperature $T_{target}$ for the headplate was set to 36° C. Without actively controlling the headplate temperature, effective testing could only begin after more than 4 hours ramp-up time ($t_2$>240). In contrast with this, controlled transfer of thermal energy from the heating foils to the headplate lead to the result that a uniform target temperature of the headplate and probe tools was reached after only 35 minutes ($t_1$=35 min). With this method it is possible to minimize the needle realignment within the process and prevent pad edge damages. Additional optical inspection of a measured wafers can also be reduced means less interrupts for continues probing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a prober apparatus, the method comprising:
    determining a target temperature of a component of a prober apparatus;
    bringing the component to the target temperature by supplying or withdrawing thermal energy to or from the component by controlling a heat exchange element, wherein the heat exchange element comprises a heating element, and wherein the heating element comprises a heating foil comprising a carrier sheet supporting a heating wire; and
    performing electronic tests on a device under test after the target temperature has been reached, the device under test being disposed inside the prober apparatus, wherein the target temperature corresponds to a stationary temperature of a portion of the component that is reached under test conditions without controlling the heat exchange element.

2. The method of claim 1, wherein controlling the heat exchange element comprises controlling a flow of thermal energy by means of pulse width modulation or automatic control on demand based on a microcontroller.

3. The method of claim 1, wherein controlling the heat exchange element comprises controlling a flow of thermal energy by means of closed-loop control.

4. A prober apparatus comprising:
    a housing that provides a testing environment;
    a support structure disposed in the housing, the support structure being adapted to support a device under test;
    a prober disposed adjacent the support structure and configured to perform electronic tests on the device under test are disposed; and
    a heat exchange element disposed adjacent the prober, wherein the heat exchange element comprises a heating element, and wherein the heating element comprises a heating foil comprising a carrier sheet supporting a heating wire; and
    a controller adapted to determine a target temperature of a component of the prober apparatus and adapted to control the heat exchange element to bring the component to the target temperature, wherein the target temperature corresponds to a stationary temperature of the component that is reached under test conditions without controlling the heat exchange element.

5. The prober apparatus of claim 4, wherein the prober comprises a probe card and a headplate, the probe card being supported on a surface of the headplate.

6. The prober apparatus of claim 4, wherein the controller is adapted to perform closed loop control of the heat exchange element.

7. The prober apparatus of claim 6, further comprising a plurality of temperature sensors coupled to the controller.

8. The prober apparatus of claim 7, wherein the temperature sensors are attached to the component of the prober apparatus.

9. The prober apparatus of claim 7, wherein the temperature sensors are attached to one single surface of the component.

10. A prober apparatus, comprising:
    a housing that provides a testing environment;
    a support structure disposed in the housing, the support structure being adapted to support a device under test;
    a prober disposed adjacent the support structure and configured to perform electronic tests on the device under test are disposed, wherein the prober comprises a probe card and a headplate, the probe card being supported on a surface of the headplate;
    a heat exchange element disposed adjacent the prober; and
    a controller adapted to determine a target temperature of a component of the prober apparatus and adapted to control the heat exchange element to bring the component to the target temperature, wherein the target temperature corresponds to a stationary temperature of the component that is reached under test conditions without controlling the heat exchange element, wherein the heat exchange element comprises a heating foil comprising a carrier sheet supporting a heating wire, the heating foil being attached to the headplate.

* * * * *